United States Patent
Imashiro et al.

(10) Patent No.: US 6,387,505 B1
(45) Date of Patent: May 14, 2002

(54) PREPREG, MULTILAYER PRINTED WIRING BOARD AND PROCESS FOR PRODUCTION OF SAID MULTILAYER PRINTED WIRING BOARD

(75) Inventors: Yasuo Imashiro; Takahiko Ito; Hideshi Tomita; Norimasa Nakamura, all of Tokyo (JP)

(73) Assignee: Nisshinbo Industries, Inc., Tokyp (JP)

( * ) Notice: Subject to any disclaimer, the term of this patent is extended or adjusted under 35 U.S.C. 154(b) by 0 days.

(21) Appl. No.: 09/399,151

(22) Filed: Sep. 20, 1999

(30) Foreign Application Priority Data

Sep. 25, 1998 (JP) .......................................... 10-271411

(51) Int. Cl.[7] .............................. B32B 27/38; B32B 3/26
(52) U.S. Cl. ................. 428/413; 428/297.4; 428/320.2; 428/901
(58) Field of Search ............................... 428/413, 901; 156/307.1, 325, 329, 330, 331.1

(56) References Cited

U.S. PATENT DOCUMENTS 5,576,398 A  *  11/1996  Takahashi et al. .......... 525/528
5,916,675 A  *  6/1999   Komoto et al. ............. 428/355 R

* cited by examiner

Primary Examiner—Robert Dawson
Assistant Examiner—Michael J Feely
(74) Attorney, Agent, or Firm—Kubovcik & Kubovcik

(57) ABSTRACT

The present invention provides a prepreg which is composed of a mixture of a polycarbodiimide resin and an epoxy resin and which has a film shape; a prepreg composed of (1) a mixture of a polycarbodiimide resin and an epoxy resin and (2) a base material; a multilayer printed wiring board obtained by alternately laminating an internal substrate and an insulating adhesive layer and adhering them to each other, wherein the above prepreg is used as the insulating adhesive; and a process for producing a multilayer printed wiring board, which comprises alternately laminating an internal substrate and the above prepreg, adhering them to each other, and allowing all the internal substrates to communicate with each other at the required portions. The above prepreg has high flexibility at room temperature, causes neither chipping nor peeling of resin, and is superior in heat resistance and electrical insulation after press molding.

7 Claims, 1 Drawing Sheet

PREPREG, MULTILAYER PRINTED WIRING BOARD AND PROCESS FOR PRODUCTION OF SAID MULTILAYER PRINTED WIRING BOARD

BACKGROUND OF THE INVENTION

(1) Field of the Invention

The present invention relates to a prepreg, a multilayer printed wiring board and a process for producing a multilayer printed wiring board. More particularly, the present invention relates to a prepreg which has high flexibility at room temperature, causes neither chipping nor peeling of resin, and is superior in heat resistance and electrical insulation after press molding; to a multilayer printed wiring board using said prepreg; and to a process for producing said multilayer printed wiring board.

(2) Description of the Prior Art

Prepregs obtained by impregnating a mat or roving made of a glass fiber or the like, with a thermosetting resin (e.g., an epoxy resin) which has been cured up to an extent slightly higher than the B-stage, are in use for molding or lamination in plastic industry. Other prepregs are also known in which the mat or roving made of a glass fiber or the like used for molding or lamination, is replaced by an aramid fiber, or the epoxy resin is replaced by a polyimide resin, a polyphenylene ether resin, a polytetrafluoroethylene resin or a polyaminobismaleimide resin.

The prepregs obtained by impregnating a glass cloth with a composition consisting of an epoxy resin and a curing agent and then semicuring the resulting material, have had problems in that they cause chipping or peeling of resin when bent.

The prepregs in which an aramid fiber is used in place of the glass cloth, are improved in bending strength but are higher in cost because the aramid fiber is expensive.

The prepregs in which a polyimide resin, a polyphenylene ether resin or a polytetrafluoroethylene resin is used in place of the epoxy resin, are relatively difficult to mold or process and moreover are expensive. The prepregs in which a polyaminobismaleimide resin is used in place of the epoxy resin, have high heat resistance; however, they are very hygroscopic and low in adhesivity and, moreover, because of the necessity of use of a high-boiling solvent when a varnish is made, contain a large amount of residual solvent and tend to generate voids during lamination.

SUMMARY OF THE INVENTION

The present invention aims at alleviating the above-mentioned problems of the prior art and providing (1) a prepreg which has high flexibility at room temperature, causes neither chipping nor peeling of resin, and is superior in heat resistance and electrical insulation after press molding, (2) a multilayer printed wiring board using such a prepreg of excellent properties, and (3) a process for producing such a multilayer printed wiring board.

The present invention provides:
a prepreg which is composed of a mixture of a polycarbodiimide resin and an epoxy resin and which has a film shape;
a prepreg composed of (1) a mixture of a polycarbodiimide resin and an epoxy resin and (2) a base material;
a multilayer printed wiring board obtained by alternately laminating an internal substrate and an insulating adhesive layer and adhering them to each other, wherein the above prepreg is used as the insulating adhesive layer; and
a process for producing a multilayer printed wiring board, which comprises alternately laminating an internal substrate and the above prepreg, adhering them to each other, and allowing all the internal substrates to communicate with each other at the required portions.

BRIEF DESCRIPTION OF THE DRAWING

In FIG. 1, numeral 1 refers to an internal substrate having a circuit pattern formed on the surface; numeral 2 refers to a prepreg; numerals 3 and 4 each refer to a copper foil; and numeral 5 refers to a multilayer printed wiring board.

DETAILED DESCRIPTION OF THE INVENTION

Figure 1:
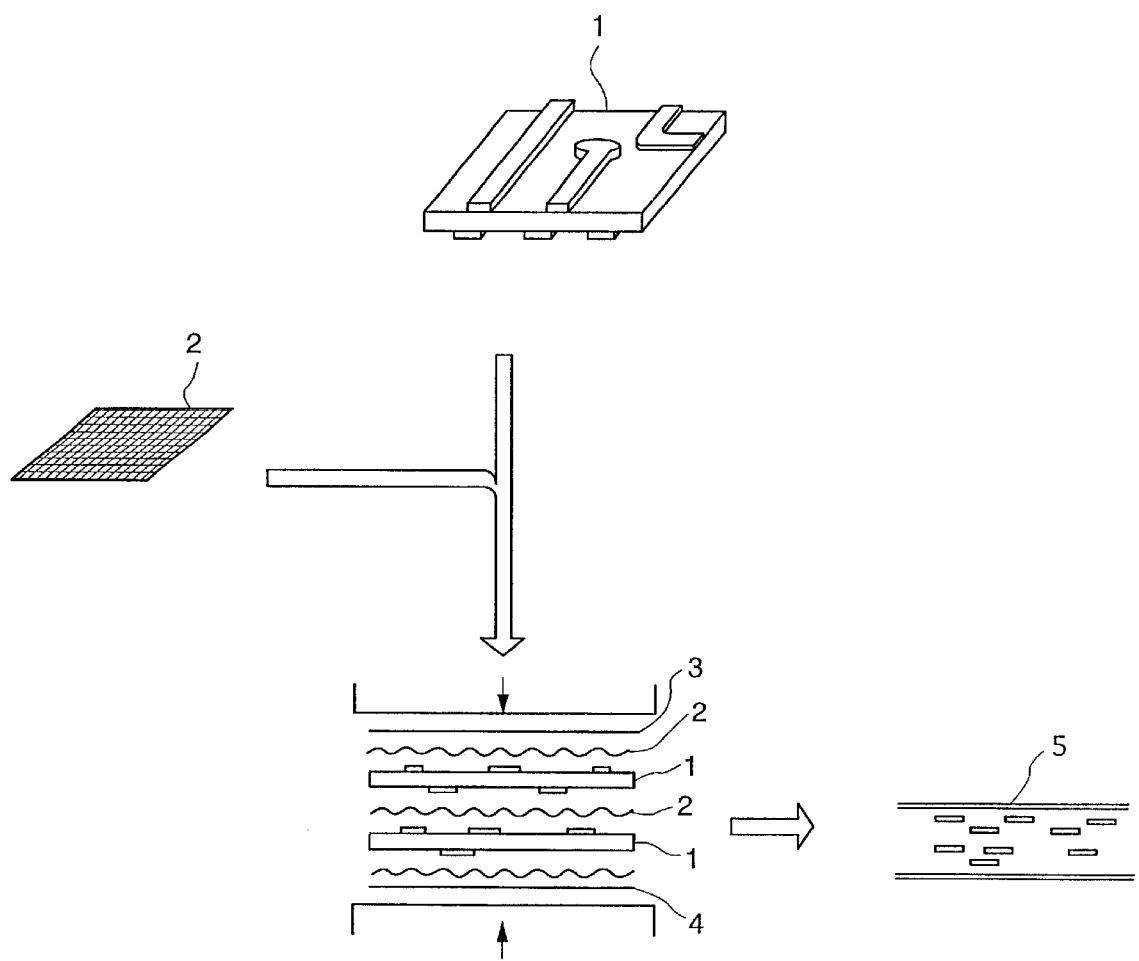
FIG. 1 shows steps employed used in production of a multilayer printed wiring board of the present invention.

The present invention is hereinafter described in detail.

The prepreg according to the present invention has two types. The first type prepreg is composed of a polycarbodiimide resin and an epoxy resin, as mentioned above. As this polycarbodiimide resin, there can be used those produced by various methods. There can be used isocyanate-terminated polycarbodiimides produced fundamentally by the conventional method for producing a polycarbodiimide [U.S. Pat. No. 2,941,956; JP-B-47-33,279; J. Org. Chem., 28, 2069–2075 (1963); Chemical Review 1981, Vol. 81, No. 4, pages 619–621], specifically by the carbon dioxide removal and condensation reaction of an organic polyisocyanate.

In the above-mentioned method, as the organic polyisocyanate which is the starting material for synthesizing the polycarbodiimide compound, there can be used, for example, aromatic polyisocyanates, aliphatic polyisocyanates, alicyclic polyisocyanates and mixtures thereof, and specifically, there can be mentioned 1,5-naphthalene diisocyanate, 4,4'-diphenylmeth ane diisocyanate, 4,4'-diphenyldimethylmethane diisocyanate, 1,3-phenylene diisocyanate, 1,4-phenylene diisocyanate, 2,4-tolylene diisocyanate, 2,6-tolylene diisocyanate, a mixture of 2,4-tolylene diisocyanate and 2,6-tolylene diisocyanate, hexamethylene diisocyanate, cyclohexane-1, 4-diisocyanate, xylylene diisocyanate, isophorone diisocyanate, dicyclohexylmethane-4,4'-diisocyanate, methylcyclohexane diisocyanate, tetramethylxylylene diisocyanate, 2,6-diisopropylphenyl diisocyanate, and 1,3, 5-triisopropylbenzene-2,4-diisocyanate.

Among them, those obtained from at least one aromatic polyisocyanate are preferable as the polycarbodiimide resin to be used in the present invention. Incidentally, the aromatic polyisocyanate refers to an isocyanate having, in the molecule, at least two isocyanate groups bonded directly to the aromatic ring.

As the above-mentioned polycarbodiimide, there can also be used those polycarbodiimides whose terminals are blocked with a compound (e.g. a monoisocyanate) reactive with the terminal isocyanates of polycarbodiimide and whose polymerization degrees are controlled at an appropriate level.

As the monoisocyanate for blocking the terminals of polycarbodiimide to control the polymerization degree thereof, there can be mentioned, for example, phenyl isocyanate, tolylene isocyanate, dimethylphenyl isocyanate, cyclohexyl isocyanate, butyl isocyanate, and naphthyl isocyanate.

As the other compounds reactive with the terminal isocyanates of polycarbodiimide, there can be used, for example, aliphatic compounds, aromatic compounds or alicyclic compounds having —OH group (such as methanol, ethanol, phenol, cyclohexanol, N-methylethanolamine, polyethylene glycol monomethyl ether, polypropylene glycol monomethyl ether and the like), =NH group (such ad diethylamine, dicyclohexylamine and the like), —NH$_2$ group (such as butylamine, cyclohexylamine and the like), —COOH group (such as propionic acid, benzoic acid, cyclohexanecarboxylic acid and the like), —SH group (such as ethylmercaptan, allylmercaptan, thiophenol and the like), epoxy group, or the like.

The carbon dioxide removal and condensation reaction of the above organic polyisocyanate proceeds in the presence of a carbodiimidation catalyst. As the carbodiimidation catalyst, there can be used, for example, phosphorene oxides such as 1-phenyl-2-phsophorene-1-oxide, 3-methyl-1-phenyl-2-phosphorene-1-oxide, 1-ethyl-2-phosphorene-1-oxide, 3-methyl-2-phosphorene-1-oxide, 3-phosphorene isomers thereof, and the like. Among them, 3-methyl-1-phenyl-2-phosphorene-1-oxide is suitable from the standpoint of reactivity.

The polycarbodiimide resin used in the present invention has a polystyrene-reduced number-average molecular weight of 3,000 to 50,000, preferably 10,000 to 30,000, and more preferably 15,000 to 25,000, as measured by gel permeation chromatography (GPC) regardless of whether or not the above-mentioned terminal-blocking agent is used. When the number-average molecular weight is smaller than 3,000, no sufficient film-formability or heat resistance can be obtained. When the number-average molecular weight exceeds 50,000, a long period of time is required for the synthesis of polycarbodiimide resin and, in addition, the polycarbodiimide resin varnish obtained has an extremely short pot life (service life). Therefore, such number-average molecular weights are not practical.

As the epoxy resin used in the present invention, there can be mentioned epoxy resins having at least two epoxy groups in the molecule, for example, glycidyl ether type epoxy resins, representatives of which are bisphenol A type epoxy resins, bisphenol F type epoxy resins, phenolic novolac type epoxy resins and cresol novolac type epoxy resins; alicyclic epoxy resins; glycidyl ester type epoxy resins; heterocyclic epoxy resins; and liquid rubber-modified epoxy resins. They are used alone or in admixture of two or more. Preferable are bisphenol A type epoxy resins, bisphenol F type epoxy resins, phenolic novolac type epoxy resins and cresol novolac type epoxy resins. However, the epoxy resins used in the present invention are not limited to them and all generally known epoxy resins may be used.

In the first type prepreg of the present invention, the proportions of the polycarbodiimide resin and the epoxy resin used are, for example, 100 parts by weight (the former resin) and 20 to 200 parts by weight, preferably 40 to 150 parts by weight, more preferably 50 to 100 parts by weight (the latter resin). When the proportion of the epoxy resin is less than 20 parts by weight, the properties of the epoxy resin hardly appear. When the proportion of the epoxy resin is more than 200 parts by weight, the resulting resin mixture has low film formability. Therefore, such amounts are not preferred.

Mixing of the polycarbodiimide resin with the epoxy resin can be conducted, for example, by mixing them at room temperature, or by mixing them with heating, or by dissolving the epoxy resin in an appropriate solvent and mixing the resulting solution with the polycarbodiimide resin. However, there is no particular restriction as to the method for their mixing.

The first type prepreg of the present invention is characterized by having a film shape. The mixture of the polycarbodiimide resin and the epoxy resin can be allowed to have a film shape, for example, by casting the mixture on a polyethylene terephthalate (PET) film subjected to a treatment for easy release, according to a known method using a coater or the like, and heating the resulting material to remove the solvent contained in the mixture. There is no particular restriction as to the method for allowing the mixture to have a film shape.

Incidentally, the "prepreg having a film shape" mentioned herein refers to a prepreg having a thickness of about 10 to 500 $\mu$m. This prepreg is different from ordinary prepregs in that it uses no base material; however, it is called a prepreg for convenience, in the present specification.

The second type prepreg of the present invention is composed of (1) a mixture of a polycarbodiimide resin and an epoxy resin and (2) a base material. Specifically, it is a prepreg obtained by impregnating a mixture of a polycarbodiimide resin and an epoxy resin into a base material and semicuring the mixture. The polycarbodiimide resin, the epoxy resin and the mixture thereof used in the second type prepreg are the same as used in the first type prepreg; therefore, no explanation is made thereon.

As the base material used in the second type prepreg of the present invention, there can be mentioned known base materials such as glass cloth, carbon fiber cloth or organic fiber cloth (e.g., aramid fiber cloth), paper and the like.

In producing the second type prepreg of the present invention, first a base material is impregnated with a mixture of a polycarbodiimide resin and an epoxy resin. The impregnation can be conducted, for example, by immersing a base material in a resin bath containing a mixture of a polycarbodiimide resin and an epoxy resin and then drying the resulting material. However, there is no particular restriction as to the method for impregnation.

There is no particular restriction, either, as to the amount of polycarbodiimide resin/epoxy resin mixture to be impregnated into base material. The amount of resin in prepreg after drying can be, for example, 10 to 90% by weight.

The proportions of the polycarbodiimide resin and the epoxy resin mixed can be, for example, 100 parts by weight (the former resin) and 20 to 200 parts by weight, preferably 40 to 150 parts, more preferably 50 to 100 parts by weight (the latter resin), similarly to those in the first type prepreg.

Next, the mixture of a polycarbodiimide resin and an epoxy resin is semicured and generally cured up to a state regarded as the B-stage. Semicuring is taken as, for example, a state in which the solvent remaining in the mixture is 1% by weight or less.

The two types of prepregs of the present invention obtained as above, each show low dielectric constant, high electrical insulation and high heat resistance, all owing to the mixture of polycarbodiimide resin and epoxy resin; and can be used in place of conventional sheet-shaped adhesives, particularly in multilayer printed wiring boards and processes for production thereof.

As shown in FIG. 1, a multilayer printed wiring board 5 can be produced according to the process of the present invention which comprises alternately laminating, between copper foils 3 and 4, an internal substrate 1 having a circuit pattern formed thereon and a first or second type prepreg 2 of the present invention, adhering these members 1 and 2 to each other, and allowing all the internal substrates 1 to communicate with each other at the required portions.

The adhesion between the internal substrate 1 and the first or second type prepreg 2 of the present invention can be made by, for example, heating.

In the multilayer printed wiring board 5 obtained as above, the internal substrate 1 and the first or second type prepreg 2 of the present invention acting as an insulating adhesive layer are laminated alternately and adhered to each other, as shown in FIG. 1.

The feature of the present invention lies in the application of a mixture of a polycarbodiimide resin and an epoxy resin to the production of a multilayer printed wiring board. That is, the present invention utilizes that the first or second type prepreg of the present invention using a mixed resin is stable and flexible at room temperature and, when heated, is cured by dimerization or trimerization of carbodiimide group such as shown below:

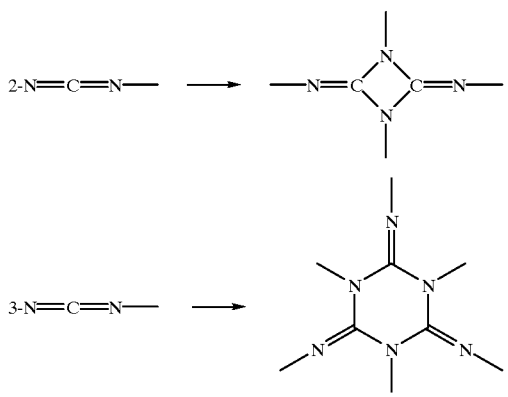

or by reaction of carbodiimide group with epoxy resin to form a heterocyclic 5-membered ring called imidazolidione, as shown below.

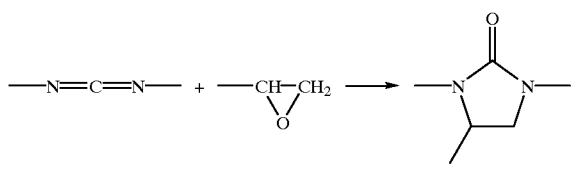

DETAILED DESCRIPTION OF PREFERRED EMBODIMENTS

The present invention is described in more detail below by way of Examples.

EXAMPLE 1

Into a reactor equipped with a stirrer and a condenser were fed 1,720 g of 4,4'-diphenylmethane diisocyanate (hereinafter referred to as MDI), 16.4 g of phenyl isocyanate (hereinafter referred to as PI), 12,900 g of tetrahydrofuran (hereinafter referred to as THF) used as a solvent, and 3.44 g of 3-methyl-1-phenyl-2-phosphorene-1-oxide used as a catalyst. The reactor contents were subjected to a reaction under refluxing for 16 hours. As a result was obtained a varnish of a polycarbodiimide having a polystyrene-reduced number-average molecular weight (Mn) of $2.0 \times 10^4$ as measured by GPC. The polycarbodiimide varnish was uniformly mixed with an epoxy resin (Epikote 828, a product of Yuka Shell Epoxy K. K.) in proportions of 100 parts by weight (polycarbodiimide resin) and 70 parts by weight (epoxy resin). The uniform mixture was casted on a release paper by the use of a coater and then dried at 65° C. for 30 minutes to produce a film-shaped prepreg having a thickness of 30 μm.

Three such prepregs were laminated, as an insulating adhesive layer, on each side of an internal substrate. On each side of the resulting laminate was placed a copper foil having a thickness of 18 μm. The resulting material was subjected to press molding at a pressure of 40 kg/cm² at 130° C. for 10 minutes and then at 200° C. for 60 minutes, whereby a copper-clad laminated plate was produced.

EXAMPLE 2

The operation of Example 1 was repeated except that the amount of Epikote 828 used was changed from 70 parts by weight to 50 parts by weight.

EXAMPLE 3

The operation of Example 1 was repeated except that 70 parts by weight of Epikote 828 was changed to 70 parts by weight of a cresol novolac type epoxy resin (ESCN-195XL, a product of Sumitomo Chemical Co., Ltd).

EXAMPLE 4

Into a reactor equipped with a stirrer and a condenser were fed 2,100 g of tolylene diisocyanate, 28.7 g of PI, 14,300 g of tetrachloroethylene used as a solvent, and 4.2 g of 3-methyl-1-phenyl-2-phosphorene-1-oxide. The reactor contents were subjected to a reaction under refluxing for 4 hours. As a result was obtained a varnish of a polycarbodiimide having a polystyrene-reduced number-average molecular weight (Mn) of $1.0 \times 10^4$ as measured by GPC. The polycarbodiimide varnish was uniformly mixed with an epoxy resin (Epikote 828, a product of Yuka Shell Epoxy K. K.) in proportions of 100 parts by weight (polycarbodiimide resin) and 70 parts by weight (epoxy resin). The uniform mixture was casted on a release paper by the use of a coater and then dried at 120° C. for 30 minutes to produce a film-shaped prepreg having a thickness of 35 μm. From these prepregs were produced a copper-clad laminated plate in the same manner as in Example 1.

EXAMPLE 5

The operation of Example 4 was repeated except that 70 parts by weight of Epikote 828 was changed to 60 parts by weight of an epoxy resin (YDF-170, a product of Toto Kasei).

EXAMPLE 6

Into a reactor equipped with a stirrer and a condenser were fed 1,720 g of MDI, 12.3 g of PI, 12,900 g of THF and 3.44 g of 3-methyl-1-phenyl-2-phosphorene-1-oxide. The reactor contents were subjected to a reaction under refluxing for 16 hours. As a result was obtained a varnish of a polycarbodiimide having a polystyrene-reduced number-average molecular weight (Mn) of $2.5 \times 10^4$ as measured by GPC. The polycarbodiimide varnish was uniformly mixed with an epoxy resin (Epikote 828, a product of Yuka Shell Epoxy K. K.) in proportions of 100 parts by weight (polycarbodiimide resin) and 70 parts by weight (epoxy resin). The uniform mixture was impregnated into a glass cloth (Product No. 7628AS905, a product of Asahi Schwebel Co., Ltd.) and dried to a semicured state to produce a prepreg of 110 μm in thickness having a resin content of 40% and using a glass cloth as the base material. From these prepregs was produced a copper-clad laminated plate in the same manner as in Example 1.

Comparative Example 1

The operation of Example 1 was repeated except that the amount of Epikote 828 used was increased from 70 parts by weight to 300 parts by weight.

Comparative Example 2

Into a reactor equipped with a stirrer and a condenser were fed 1,000 g of MDI, 119 g of PI, 8,600 g of THF, and 2.2 g of 3-methyl-1-phenyl-2-phosphorene-1-oxide used as a catalyst. The reactor contents were subjected to a reaction under refluxing for 10 hours. As a result was obtained a varnish of a polycarbodiimide having a polystyrene-reduced number-average molecular weight (Mn) of $2.1 \times 10^3$ as measured by GPC. The polycarbodiimide varnish was uniformly mixed with an epoxy resin (Epikote 828, a product of Yuka Shell Epoxy K. K.) in proportions of 100 parts by weight (polycarbodiimide resin) and 70 parts by weight (epoxy resin). The uniform mixture was casted on a release paper by the use of a coater and then dried at 65° C. for 30 minutes to produce a film-shaped prepreg having a thickness of 35 μm. From these prepregs were produced a copper-clad laminated plate in the same manner as in Example 1.

Comparative Example 3

An epoxy resin varnish having the following composition was impregnated into a glass cloth (Product No. 7628AS905, a product of Asahi Schwebel Co., Ltd.) and dried to a semicured state to produce a prepreg sheet of 100 m in thickness having a resin content of 40% and using a glass cloth as the base material.

| Epoxy resin varnish | |
|---|---|
| Epoxy resin (DER-511, a product of Dow Chemical) | 100 parts by weight |
| Curing agent (dicyandiamide) | 5 parts by weight |
| Curing accelerator (2-ethyl-4-methylimidazole) | 0.15 part by weight |
| Solvent (methyl ethyl ketone) | 40 parts by weight |
| Solvent (DMF) | 10 parts by weight |

From these prepregs was produced a copper-clad laminated plate in the same manner as in Example 1.

The copper-clad laminated plates or prepregs produced above were measured for the following properties according to the following methods. The results are shown in Table 1.

Dielectric Constant and Dielectric Loss Tangent

Values at 1 MHz were measured for the copper-clad laminated plates of the Examples and the Comparative Examples, using HP-4284A LCR Meter (a product of Hewlett Packard) according to JIS K 6911.

Resistance

Surface resistance and volume resistance were measured for the copper-clad laminated plates of the Examples and the Comparative Examples, using 4239A High Resistance Meter (a product of Yokogawa Hewlett Packard) according to JIS C 6481.

Resistance to Soldering Heat Test

Five specimens were used for each sample. A case in which no specimen showed swelling when tested at 260° C. for 60 seconds, was reported as o; and a case in which all specimens showed swelling, was reported as X.

Glass Transition Temperature

Each of the prepregs produced in the Examples and the Comparative Examples was heat-treated at 250° for 20 minutes and then measured for glass transition temperature using Rheolograph Solid (a product of Toyo Seiki). The temperature elevation rate was 5° C./min, the frequency was 10 Hz, and a peak top of tan δ was taken as glass transition temperature (Tg).

TABLE 1

| | Examples | | | | | | Comp. Examples | | |
|---|---|---|---|---|---|---|---|---|---|
| | 1 | 2 | 3 | 4 | 5 | 6 | 1 | 2 | 3 |
| Dielectric constant | 3.6 | 3.5 | 3.9 | 3.8 | 3.9 | 4.2 | 4.3 | 3.9 | 4.5 |
| Dielectric loss tangent | 0.008 | 0.007 | 0.009 | 0.007 | 0.01 | 0.015 | 0.01 | 0.009 | 0.02 |
| Tg (° C.) | >250 | >250 | >250 | 240 | 215 | — | 155 | 130 | — |
| Resistance to soldering heat test | ○ | ○ | ○ | ○ | ○ | ○ | ○ | × | ○ |
| Surface resistance (Ω) | >$10^{15}$ | >$10^{15}$ | >$10^{15}$ | >$10^{15}$ | >$10^{15}$ | >$10^{15}$ | $4 \times 10^{14}$ | >$10^{15}$ | $5 \times 10^{13}$ |
| Volume resistance (Ωcm) | >$10^{16}$ | >$10^{16}$ | >$10^{16}$ | >$10^{16}$ | >$10^{16}$ | >$10^{16}$ | $2 \times 10^{15}$ | >$10^{16}$ | $4 \times 10^{14}$ |
| Appearance of prepreg[1] | ○ | ○ | ○ | ○ | ○ | ○ | × | × | ○ |

[1]Visual observation was made and rating was made according to the following standard.
○ : The surface of prepreg was smooth and had no residual bubbles.
×: The surface had many unevennesses, was very tacky, and had many residual bubbles.

The first type prepreg of the present invention is composed of a mixture of a polycarbodiimide resin and an epoxy resin and has a film shape. It has low dielectric constant, high electrical insulation and high heat resistance; moreover, containing no base material, it enables production of a thin prepreg and a thin multilayer printed wiring board.

The second type prepreg of the present invention is composed of (1) a mixture of a polycarbodiimide resin and an epoxy resin and (2) a base material. It has low dielectric constant, high electrical insulation and high heat resistance, has high flexibility at room temperature, causes neither chipping nor peeling of resin, and is superior in heat resistance and electrical insulation after press molding.

The multilayer printed wiring board of the present invention is obtained by alternately laminating an internal substrate and an insulating adhesive layer and adhering them to each other. In the present multilayer printed wiring board, the prepreg of the present invention is used as the insulating adhesive layer; therefore, the low dielectric constant, high electrical insulation and high heat resistance possessed by the polycarbodiimide resin/epoxy resin mixture present in the above prepreg satisfy various requirements for printed wiring board. The present multilayer printed wiring board can be produced easily. Therefore, the present multilayer printed wiring board has a high industrial value.

What is claimed is:

1. A prepreg which is composed of a mixture of a polycarbodiimide resin and an epoxy resin and which has a film shape, wherein the polycarbodiimide resin has a polystyrene-reduced number-average molecular weight of 3,000 to 50,000 as measured by gel permeation chromatography and is obtained by carbon dioxide removal reaction of an organic diisocyanate in the presence of tetrahydrofuran or tetrachloroethylene as a solvent, and the proportion of the epoxy resin is 20 to 200 parts by weight per 100 parts by weight of the polycarbodiimide resin.

2. A prepreg according to claim 1, wherein the polycarbodiimide resin is obtained from at least one kind of aromatic polyisocyanate.

3. A prepreg composed of (1) a mixture of a polycarbodiimide resin and an epoxy resin and (2) a base material, wherein the polycarbodiimide resin has a polystyrene-reduced number-average molecular weight of 3,000 to 50,000 as measured by gel permeation chromatography and is obtained by carbon dioxide removal reaction of an organic diisocyanate in the presence of tetrahydrofuran or tetrachloroethylene as a solvent, and the proportion of the epoxy resin is 20 to 200 parts by weight per 100 parts by weight of the polycarbodiimide resin.

4. A prepreg according to claim 3, wherein the polycarbodiimide resin is obtained from at least one kind of aromatic polysocyanante.

5. A prepreg according to claim 3, which is obtained by impregnating the mixture (1) of a polycarbodiimide resin and an epoxy resin into the base material (2) and semicuring the mixture (1).

6. A prepreg according to claim 5, wherein the polycarbodiimide resin is obtained from at least one kind of aromatic polysocyanante.

7. A multilayer printed wiring board obtained by alternately laminating an internal substrate and an insulating adhesive layer and adhering them to each other, wherein a prepreg set forth in claim 1 is used as the insulating adhesive layer.

* * * * *